(12) United States Patent
Hou

(10) Patent No.: US 12,376,293 B2
(45) Date of Patent: Jul. 29, 2025

(54) ANTI-FUSE ARRAY STRUCTURE, OPERATION METHOD THEREOF AND MEMORY

(71) Applicant: CHANGXIN MEMORY TECHNOLOGIES, INC., Hefei (CN)

(72) Inventor: Chuangming Hou, Hefei (CN)

(73) Assignee: CHANGXIN MEMORY TECHNOLOGY, INC., Hefei (CN)

( * ) Notice: Subject to any disclaimer, the term of this patent is extended or adjusted under 35 U.S.C. 154(b) by 339 days.

(21) Appl. No.: 18/166,018

(22) Filed: Feb. 8, 2023

(65) Prior Publication Data

US 2023/0363152 A1  Nov. 9, 2023

Related U.S. Application Data

(63) Continuation of application No. PCT/CN2022/101049, filed on Jun. 24, 2022.

(30) Foreign Application Priority Data

Jun. 6, 2022 (CN) .......................... 202210633192.4

(51) Int. Cl.
| | | |
|---|---|---|
| G11C 11/00 | (2006.01) | |
| G11C 7/00 | (2006.01) | |
| G11C 17/16 | (2006.01) | |
| G11C 17/18 | (2006.01) | |
| H10B 20/25 | (2023.01) | |

(52) U.S. Cl.
CPC ............. *H10B 20/25* (2023.02); *G11C 17/16* (2013.01); *G11C 17/18* (2013.01)

(58) Field of Classification Search
CPC ........ H10B 20/25; G11C 17/16; G11C 17/18; H01L 23/5252
See application file for complete search history.

(56) References Cited

U.S. PATENT DOCUMENTS

| | | | |
|---|---|---|---|
| 9,805,828 | B1 | 10/2017 | Yoko |
| 2008/0007986 | A1 | 1/2008 | Jeong |
| 2010/0090213 | A1 | 4/2010 | Jeong |
| 2013/0062698 | A1 | 3/2013 | Agam |
| 2013/0294141 | A1* | 11/2013 | Oh .......................... G11C 17/18 365/96 |
| 2013/0307046 | A1 | 11/2013 | Agam |

(Continued)

FOREIGN PATENT DOCUMENTS

| | | |
|---|---|---|
| CN | 101101793 A | 1/2008 |
| CN | 105304636 A | 2/2016 |

(Continued)

OTHER PUBLICATIONS

TW first office action in application No. 112120922, issued on May 3, 2024.

*Primary Examiner* — Hien N Nguyen
(74) *Attorney, Agent, or Firm* — Syncoda LLC; Feng Ma

(57) ABSTRACT

An anti-fuse array structure, an operation method thereof and a memory are provided. The anti-fuse array structure includes an anti-fuse array area and a selection circuit area. The anti-fuse array area includes a plurality of anti-fuse cells, and the selection circuit area includes a plurality of selection transistors. The selection circuit area is located on at least one side of the anti-fuse array area.

18 Claims, 5 Drawing Sheets

(56) References Cited

U.S. PATENT DOCUMENTS

| | | | |
|---|---|---|---|
| 2013/0322150 A1* | 12/2013 | Kim | G11C 17/08 |
| | | | 365/104 |
| 2015/0103579 A1* | 4/2015 | Yanagisawa | G11C 17/18 |
| | | | 365/96 |
| 2015/0380102 A1 | 12/2015 | Choi | |
| 2017/0186756 A1 | 6/2017 | Choi | |
| 2022/0320121 A1 | 10/2022 | Li et al. | |

FOREIGN PATENT DOCUMENTS

| CN | 106910733 A | 6/2017 |
|---|---|---|
| CN | 105609485 B | 6/2020 |
| CN | 113496986 A | 10/2021 |
| CN | 113571511 A | 10/2021 |

\* cited by examiner

ANTI-FUSE ARRAY STRUCTURE, OPERATION METHOD THEREOF AND MEMORY

CROSS-REFERENCE TO RELATED APPLICATIONS

The present disclosure is a US continuation application of International Application No. PCT/CN2022/101049, filed on Jun. 24, 2022, which claims the priority to Chinese patent application No. 202210633192.4, filed on Jun. 6, 2022, and entitled "ANTI-FUSE ARRAY STRUCTURE, OPERATION METHOD THEREOF AND MEMORY". The disclosures of International Application No. PCT/CN2022/101049 and Chinese patent application No. 202210633192.4 are hereby incorporated by reference in their entireties.

BACKGROUND

One-time programmable devices based on anti-fuse technology are widely used in DRAM, NAND and other memories. Anti-fuse device is a semiconductor device composed of two conductive layers and a dielectric layer between the conductive layers. When it is not programmed, the conductive layers are separated by the dielectric layer, and two ends of the anti-fuse are disconnected. When it is programmed (a high voltage is applied from external), the dielectric layer is broken down by high electric field, and an electrical connection is formed between the conductive layers on two sides, and the anti-fuse is short-circuited (fused). This fusion process is physically disposable, permanent and irreversible. The logic "0" and logic "1" can be represented respectively by the two states (conductive state and disconnected state) of anti-fuse.

SUMMARY OF THE INVENTION

The present disclosure relates to the field of integrated circuit technology, in particular to an anti-fuse array structure, an operation method thereof and a memory.

Embodiments of the present disclosure provide an anti-fuse array structure, an operation method thereof, and a memory.

According to a first aspect of embodiments of the present disclosure, an anti-fuse array structure is provided. The anti-fuse array structure includes an anti-fuse array area and a selection circuit area. The anti-fuse array area includes a plurality of anti-fuse cells, and the selection circuit area includes a plurality of selection transistors. The selection circuit area is located on at least one side of the anti-fuse array area.

According to a second aspect of embodiments of the present disclosure, a method for operating an anti-fuse array structure is provided. The method includes the following operations. An anti-fuse array structure as described in any of the embodiments is provided. A programming operation or a reading operation is performed on the anti-fuse array structure.

According to a third aspect of embodiments of the present disclosure, a memory is provided. The memory includes an anti-fuse memory array circuit as described in any of the above embodiments.

BRIEF DESCRIPTION OF THE DRAWINGS

To more clearly explain the embodiments of the present disclosure or the technical solution in the conventional technique, the accompanying drawings required for use in the embodiments will be briefly described below. It will be apparent that the accompanying drawings described below are only some of the embodiments of the present disclosure, from which other accompanying drawings may be obtained without any creative effort by an ordinary skilled person in the art.

DETAILED DESCRIPTION

Figure 1:
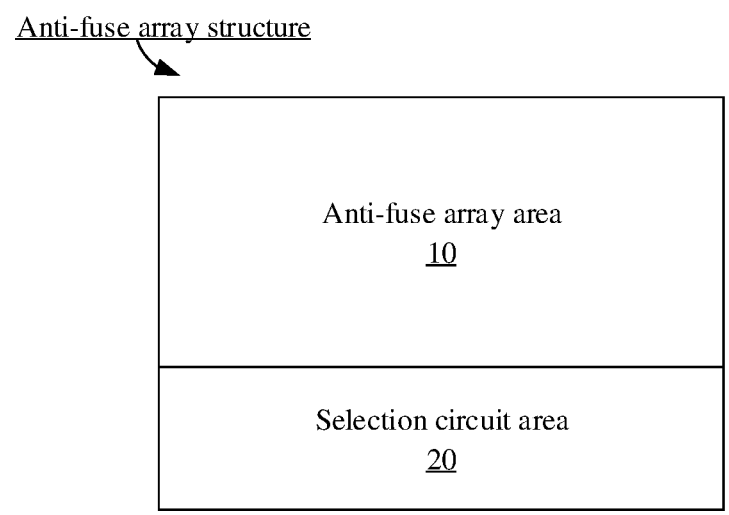
FIG. 1 is a schematic diagram of a layout of an anti-fuse array structure provided by some embodiments of the present disclosure.

Exemplary embodiments of the present disclosure will be described in more detail below with reference to the accompanying drawings. While exemplary embodiments of the present disclosure are shown in the accompanying drawings, it should be understood that the present disclosure may be implemented in various forms and should not be limited by the specific embodiments set forth herein. Rather these embodiments are provided to enable a more thorough understanding of the present disclosure and to fully convey the scope of the present disclosure to those skilled in the art.

The reference numbers in the drawings are described in the following: 10—anti-fuse array area, 11—anti-fuse cell, 12—first active area, 13—anti-fuse cell gate line, 14—first contact plug, 15—third contact plug, 16—first metal layer, 20—selection circuit area, 201—first selection circuit area, 202—second selection circuit area, 21—selection transistor, 22—second active area, 23—selection transistor gate line, 231—first selection transistor gate line, 232—second selection transistor gate line, 24—second contact plug, 25—fourth contact plug, 26—second metal layer, 27—connector, 31—bit line, and 32—bit line signal input end.

In the following description, numerous specific details are given to provide a more thorough understanding of the present disclosure. However, it should be apparent to those skilled in the art that the present disclosure may be implemented without one or more of these details. In other examples, some technical features well known in the art are not described in order to avoid confusion with the present disclosure. That is, all features of the actual embodiments are not described herein and well-known functions and structures are not described in detail.

In the accompanying drawings, the dimensions of layers, areas and elements and their relative dimensions may be exaggerated for clarity. Throughout, the same reference numerals denote the same elements.

It should be understood that when an element or layer is referred to as "on", "adjacent to", "connected to" or "coupled to" another element or layer, it may be directly on, adjacent to, connected to, or coupled to the other element or layer, or there is a intervening element or layer. Conversely, when an element is referred to as "directly on", "directly adjacent to", "directly connected to" or "directly coupled to"

another element or layer, there is no intervening element or layer. It should be understood that while the terms first, second, third, etc. may be used to describe various elements, components, areas, layers, and/or portions, such elements, components, areas, layers, and/or portions should not be limited by such terms. These terms are used only to distinguish one element, component, area, layer, or portion from another element, component, area, layer, or portion. Thus, the first element, component, area, layer, or portion discussed below may be represented as a second element, component, area, layer, or portion without departing from the teachings of the present disclosure. While a second element, component, area, layer or portion is discussed, it does not imply that a first element, component, area, layer or portion is necessarily present in the present disclosure.

Spatial relation terms such as "under", "below", "underneath", "beneath", "over", "on", etc. may be used herein for convenience of description to describe the relationship of one element or feature with other elements or features shown in the figures. It should be understood that the spatial relationship term is intended to include different orientations of devices in use and operation in addition to the orientations shown in the figures. For example, if the device in the accompanying drawings is flipped, then the element or feature described as "below" or "under" or "beneath" the other element or feature will be oriented "over" the other element or feature. Thus, the exemplary terms "below" and "under" may include both upper and lower orientations. The device may be additionally oriented (rotated 90 degrees or otherwise) and the spatial descriptors used herein are interpreted accordingly.

The terms used herein is intended to describe specific embodiments only and is not to be a limitation of the present disclosure. As used herein, the singular forms of "a", "an" and "the/said" are also intended to include the plural forms, unless the context clearly indicates otherwise. It should also be understood that when the terms "being composed" and/or "comprising" are used in the description, it is determined that there are the features, integers, steps, operations, elements and/or components, but which do not exclude the presence or addition of one or more other features, integers, steps, operations, elements, components and/or groups. As used herein, the term "and/or" includes any and all combinations of related listed items.

In order to thoroughly understand the present disclosure, detailed steps and detailed structures will be set forth in the following description in order to illustrate the technical solutions of the present disclosure. Preferred embodiments of the present disclosure are described in detail below. However, the present disclosure may have other embodiments in addition to these detailed descriptions.

Typically, each anti-fuse device includes an anti-fuse cell and a selection transistor electrically connected to the anti-fuse cell, and the gate voltage of the selection transistor is used as a control signal to implement the programming operation of the anti-fuse cell. However, in the anti-fuse array structure including multiple anti-fuse devices, each selection transistor electrically connected to the anti-fuse cell needs to occupy a limited area of the chip, and the selection transistor located in the anti-fuse array structure will affect the overall layout of the anti-fuse cell, which limits the development of miniaturization and high integration level of the chip.

The current anti-fuse array structure composed of multiple anti-fuse devices has some problems, such as occupying a large chip area and poor uniformity, which is not conducive to the miniaturization development of chips. Therefore, how to optimize the anti-fuse array structure is an urgent technical problem to be solved at present.

In the embodiments of the present disclosure, a selection circuit area including a plurality of selection transistors is arranged on the periphery of the anti-fuse array area, so that the anti-fuse array is greatly reduced in the length and width directions, and the area of the anti-fuse array is significantly reduced. Based on this structure, the layout of active areas and anti-fuse cell gate lines can be more uniform, which is helpful to improve the uniformity of anti-fuse array. At the same time, most of control signals of the selection transistor gate lines can be omitted, and only one set of control signals of the selection transistor gate line is need to be retained.

Figure 2:
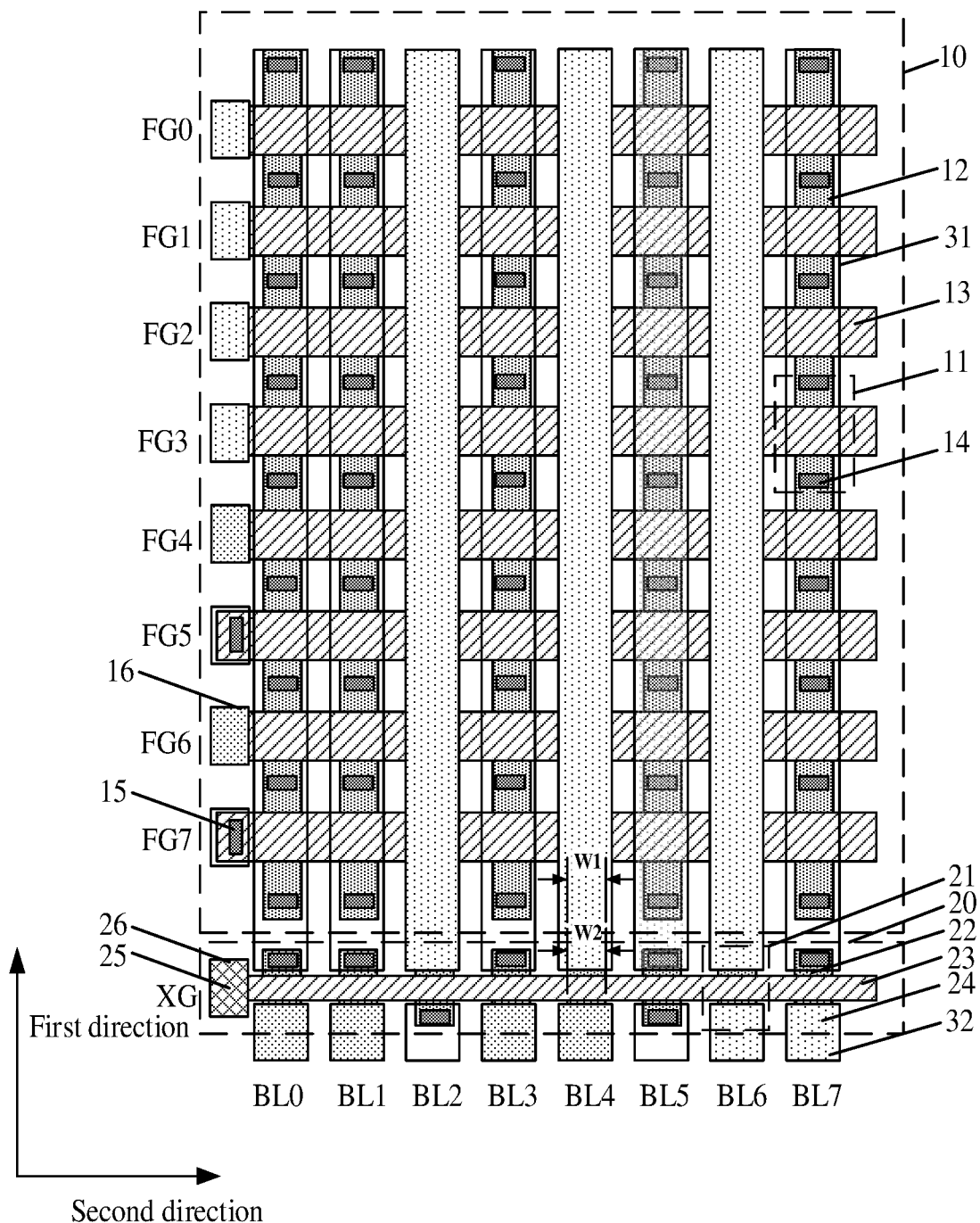
FIG. 2 is a schematic diagram of a structure of an anti-fuse array structure provided by some embodiments of the present disclosure.

The embodiments of the present disclosure provide an anti-fuse array structure. FIG. 1 is a schematic diagram of a layout of an anti-fuse array structure provided by some embodiments of the present disclosure. FIG. 2 is a schematic diagram of a structure of an anti-fuse array structure provided by some embodiments of the present disclosure.

Referring to FIG. 1 and FIG. 2, the anti-fuse array structure includes an anti-fuse array area 10 and a selection circuit area 20. The anti-fuse array area 10 includes a plurality of anti-fuse cells 11, and the selection circuit area 20 includes a plurality of selection transistors 21. The selection circuit area 20 is located on at least one side of the anti-fuse array area 10.

In the anti-fuse array structure provided by some embodiments of the present disclosure, the selection transistors is arranged on the periphery of the anti-fuse array area, so that the anti-fuse array is greatly reduced in the length and width directions, and the area of the anti-fuse array is significantly reduced. Based on this structure, the layout of active areas and anti-fuse cell gate lines can be more uniform, which is helpful to improve the uniformity of anti-fuse array. At the same time, most of control signals of the selection transistor gate lines can be omitted, and only one set of control signals of the selection transistor gate line is need to be retained.

In some embodiments of the present disclosure, the anti-fuse cell may have a transistor structure. The transistor includes a gate and two doped areas located on two sides of the gate. The two doped areas are a first electrode and a second electrode, respectively. The first electrode may be a source and the second electrode may be a drain. Alternatively, the first electrode may be a drain and the second electrode may be a source. In practical operation, adjacent anti-fuse transistors may share a same doped area (as a first electrode or a second electrode) to improve space utilization, so that bit lines are electrically connected to the first electrodes and second electrodes of a plurality of anti-fuse cells at the same time. In this way, the programming operation may be performed on the anti-fuse cell from two sides at the same time, and the programming efficiency is improved. In actual operation, the anti-fuse cell may include a metal oxide semiconductor (MOS) transistor, such as a P-type metal oxide semiconductor (PMOS) transistor or an N-type metal oxide semiconductor (NMOS) transistor or the like. It should be noted that embodiments of the present disclosure include but are not limited thereto. The anti-fuse cell may also have a capacitor structure. The capacitor structure may include a gate and a doped area on one side of the gate. Hereinafter, an anti-fuse cell having a transistor structure is taken an example to be described, but which does not constitute a limitation to the embodiments of the present disclosure.

In some embodiments, referring to FIG. 2, a plurality of anti-fuse cells 11 are arranged as an anti-fuse cell array which comprises a plurality of anti-fuse cell rows and a plurality of anti-fuse cell columns. Each of the selection transistors 21 is electrically connected to one column of anti-fuse cells 11 correspondingly, and each of the selection transistors 21 is configured to select the anti-fuse cells 11 electrically connected thereto from the anti-fuse cell array for performing a programming operation thereon. Here, the row extension direction and the column extension direction of the anti-fuse cell array may be perpendicular to each other.

In some embodiments, referring to FIG. 2, the anti-fuse array area includes a plurality of first active areas 12 and a plurality of anti-fuse cell gate lines 13. The plurality of first active areas 12 are arranged in parallel with each other and extend along a first direction. The plurality of anti-fuse cell gate lines 13 are arranged in parallel with each other and extend along a second direction, and the plurality of first active areas 12 and the plurality of anti-fuse cell gate lines 13 are intersected with each other to define the plurality of anti-fuse cells 11 arranged in an array.

In practical operation, the first active areas are arranged on a substrate. The substrate may be silicon, silicon germanium, germanium, or other suitable semiconductor. The first active areas may form an N-type doped area by doping an N-type dopant such as phosphorus, arsenic, other N-type dopants or a combination thereof, and form a P-type doped area by doping a P-type dopant such as boron, indium, other P-type dopants or a combination thereof. In practical operation, the first active area may include a source/drain doped area. The materials of the anti-fuse cell gate lines may include, but are not limited to, polysilicon, titanium nitride, metallic tungsten, or a combination thereof. In practical operation, the first direction is the column extension direction of the anti-fuse cell array, and the second direction is the row extension direction of the anti-fuse cell array, and the first direction may be perpendicular to the second direction, which can further improve the integration level of the structure.

In some embodiments, referring to FIG. 1 and FIG. 2, the selection circuit area 20 is located on one side, in the first direction, of the anti-fuse array area 10. In this way, the overall layout is simple, the anti-fuse array structure occupies a small area, the process is simple, the interconnection lines are few, and the integration level is high.

In some embodiments, referring to FIG. 2, the selection circuit area 20 includes a plurality of second active areas 22 and a selection transistor gate line 23. The plurality of second active areas 22 are located on a same side, in the first direction, of the anti-fuse array area 10, and the plurality of second active areas 22 are arranged along the second direction. The selection transistor gate line 23 extends along the second direction, and the selection transistor gate line 23 covers a partial region of each of the second active areas 22. In practical operation, the second active areas are arranged on a substrate. The substrate may be silicon, silicon germanium, germanium, or other suitable semiconductor. The second active areas may form an N-type doped area by doping an N-type dopant such as phosphorus, arsenic, other N-type dopants or a combination thereof, and form a P-type doped area by doping a P-type dopant such as boron, indium, other P-type dopants or a combination thereof. In practical operation, the second active area may include a source/drain doped area. The material of the selection transistor gate line may include, but are not limited to, polysilicon, titanium nitride, metallic tungsten, or a combination thereof.

In some embodiments, referring to FIG. 2, a width W2 of the second active area 22 along the second direction is the same as a width W1 of the first active area along the second direction. The width of each of the second active areas is the same as the width of each of the first active areas, which is beneficial to the preparation of the mask and reduces the difficulty of the patterning process.

In some embodiments, referring to FIG. 2, the anti-fuse array structure further includes a plurality of bit lines 31 located above the plurality of first active areas 12. The plurality of bit lines 31 are arranged in parallel with each other and extend along the first direction, each of the bit lines 31 is electrically connected to first electrodes and second electrodes of anti-fuse cells 11 in one column, and each of the bit lines 31 is electrically connected to a bit line signal input end 32 through one selection transistor 21. Here, the material of the bit lines includes, but is not limited to, tungsten (W), copper (Cu), titanium (Ti), tantalum (Ta), titanium nitride (TiN), tantalum nitride (TaN), polysilicon, doped silicon, metal silicide, metal alloy, or any combination thereof.

In some embodiments of the present disclosure, one selection transistor is electrically connected to one column of anti-fuse cells, so that one column of anti-fuse cells is driven by one selection transistor. The number of control signals is greatly saved compared with one selection transistor controlling one anti-fuse cell in the related technology.

Specifically, referring to FIG. 2, the anti-fuse cell array is an 8*8 anti-fuse array structure. That is, the anti-fuse array structure includes 8 bit lines BL and 8 anti-fuse cell gate lines FG, and 8 anti-fuse cells are connected to each bit line. Although FIG. 2 shows only 8 bit lines BL and 8 anti-fuse cell gate lines FG, the anti-fuse array structure may include any other number of bit lines BL and anti-fuse cell gate lines FG in other embodiments. For example, an anti-fuse array structure may include 16 bit lines BL and 16 anti-fuse cell gate lines FG, or 32 bit lines BL and 32 anti-fuse cell gate lines FG.

In some embodiments, referring to FIG. 2, the anti-fuse array structure further includes a plurality of first contact plugs 14 located on each of the plurality of first active areas 12 and a plurality of second contact plugs 24 located on each of the plurality of second active areas 22. The first electrodes and the second electrodes of the anti-fuse cells 11 in one column are electrically connected to each of the bit lines 31 through the plurality of first contact plugs 14. A first electrode of the selection transistor 21 is electrically connected to the bit line 31 through one second contact plug 24, and a second electrode of the selection transistor 21 is electrically connected to the bit line signal input end 32 through another second contact plug 24.

In some embodiments, ohmic contact between the bottom of the first contact plug and the first/second electrode of the anti-fuse cell and between the bottom of the second contact plug and the first/second electrode of the selection transistor may be implemented through a metal silicide layer to reduce series resistance. The metal silicide layer includes a silicide of iron, cobalt, nickel, platinum, or alloys thereof, such as nickel silicide, platinum silicide, cobalt silicide, or alloys thereof with low resistivity.

In some embodiments, referring to FIG. 2, the anti-fuse array structure further includes the third contact plugs 15 and the fourth contact plug 25. The anti-fuse cell gate lines 13 are electrically connected to traces in the first metal layers 16 through the third contact plugs 15. The selection transistor gate line 23 is electrically connected to the trace in the second metal layer 26 through the fourth contact plug 25. The first metal layer 16 and the second metal layer 26 may be the same film layer or may be different film layers.

Figure 3:
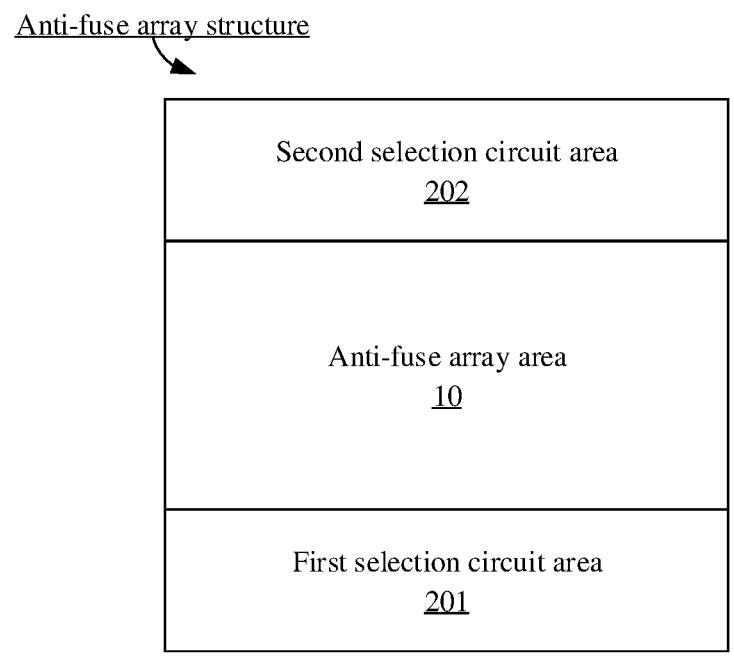
FIG. 3 is a schematic diagram of a layout of another anti-fuse array structure provided by some embodiments of the present disclosure.
Figure 4:
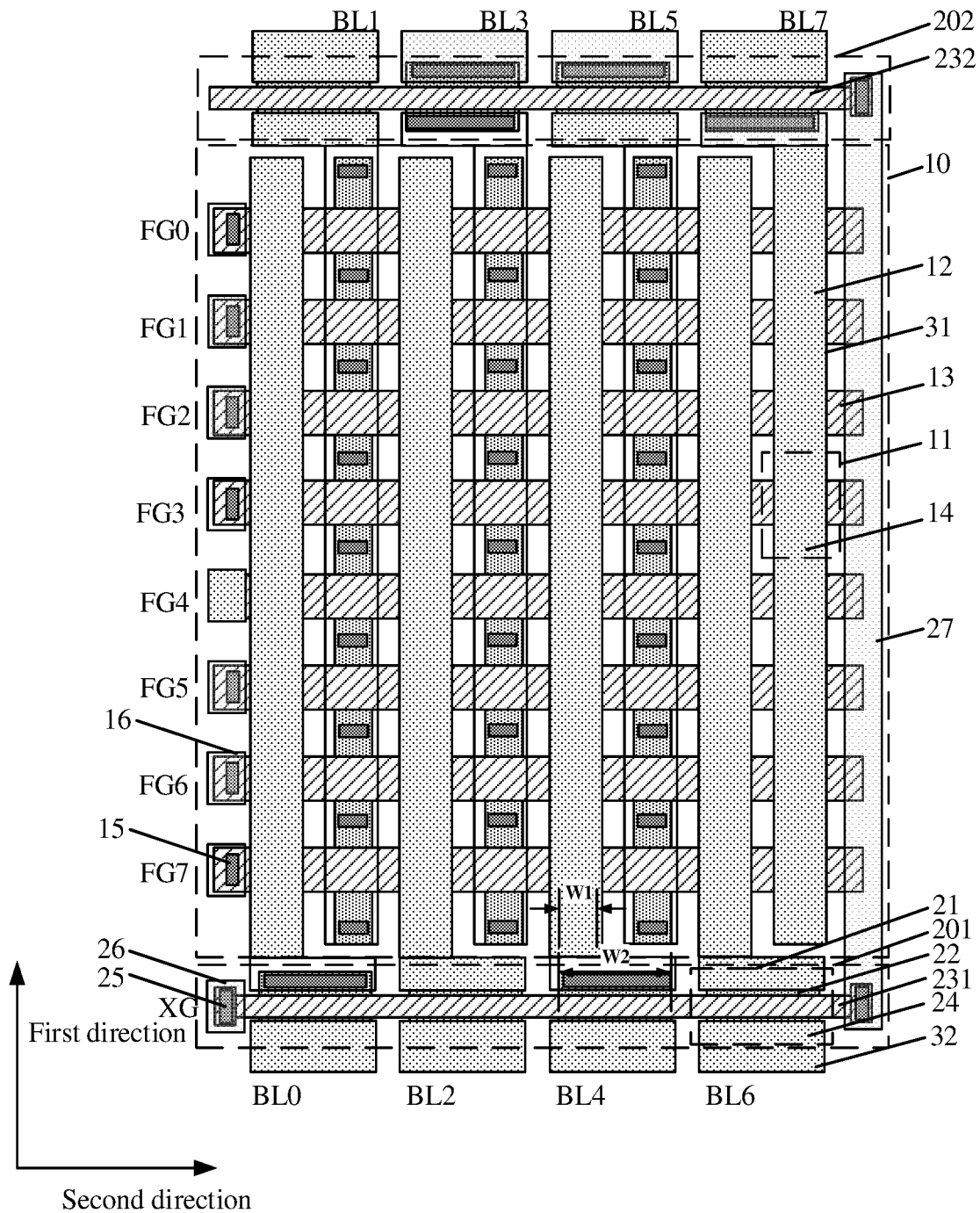
FIG. 4 is a schematic diagram of a structure of another anti-fuse array structure provided by some embodiments of the present disclosure.

In some embodiments, referring to FIG. 3 and FIG. 4, the selection circuit area 20 includes a first selection circuit area 201 and a second selection circuit area 202. The first selection circuit area 201 is located on one side, in the first direction, of the anti-fuse array area 10, and the second selection circuit area 202 is located on the other side, in the first direction, of the anti-fuse array area 10. In this way, the area occupied by the selection circuit area is increased, so that the width of the second active areas can be increased, and further the driving current of the selection transistors can be increased.

In some embodiments, referring to FIG. 4, the anti-fuse array area 10 includes a plurality of columns of anti-fuse cells 11. Selection transistors 21 electrically connected to even-numbered columns of anti-fuse cells 11 are located on one side, in the first direction, of the anti-fuse array area 10, and selection transistors 21 electrically connected to odd-numbered columns of anti-fuse cells 11 are located on the other side, in the first direction, of the anti-fuse array area 10. Thus, the areas on two sides of the anti-fuse array area are fully utilized, and the space utilization ratio of the selection transistors on two sides of the anti-fuse array area is high. The symmetrical arrangement also makes the structure more stable, and the patterning process is easy to control and adjust. For example, the anti-fuse array area 10 includes eight columns of anti-fuse cells, each column of anti-fuse cells are electrically connected to BL0, BL1 . . . BL7, respectively. The selection transistors electrically connected to BL0, BL2, BL4, BL6 are located on one side of the anti-fuse array area, and selection transistors electrically connected to BL1, BL3, BL5, BL7 are located on the other side of the anti-fuse array area.

In some embodiments, referring to FIG. 4, the selection circuit area 20 includes a plurality of second active areas 22, a first selection transistor gate line 231, a second selection transistor gate line 232 and a connector 27. The plurality of second active areas 22 are arranged on both sides, in the first direction, of the anti-fuse array area 10, and a plurality of second active areas 22 on each side are arranged along the second direction. The first selection transistor gate line 231 extends along the second direction, and the first selection transistor gate line 231 covers a partial region of each of second active areas 22 located on one side, in the first direction, of the anti-fuse array area 10. The second selection transistor gate line 232 extends along the second direction, and the second selection transistor gate line 232 covers a partial region of each of second active areas 22 located on the other side, in the first direction, of the anti-fuse array area 10. The connector 27 electrically connects the first selection transistor gate line 231 and the second selection transistor gate line 232. The material of the connector includes a conductive material. The conductive material includes, but not limited to, tungsten (W), copper (Cu), titanium (Ti), tantalum (Ta), titanium nitride (TiN), tantalum nitride (TaN), polysilicon, doped silicon, metal silicide, metal alloy, or any combination thereof. The extension direction of the connector may be parallel to the first direction.

In some embodiments, referring to FIG. 4, a width W2 of each of the second active areas along the second direction is greater than or equal to twice a width W1 of each of the first active areas along the second direction. In this way, the driving current of the selection transistor can be increased.

Figure 5:
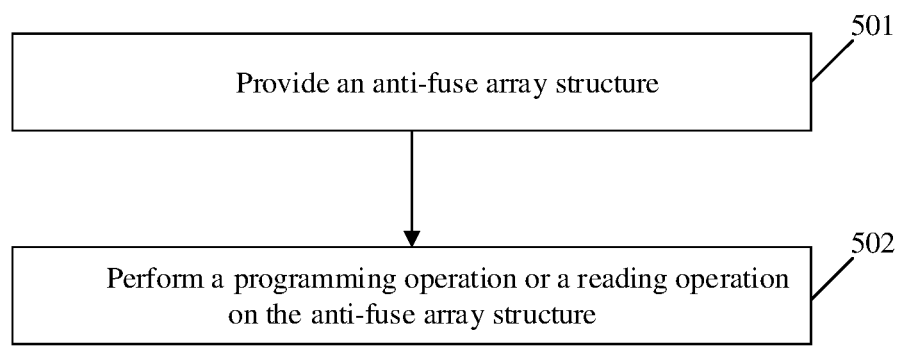
FIG. 5 is a flow diagram of a method for operating an anti-fuse array structure provided by some embodiments of the present disclosure.

The embodiments of the present disclosure also provide a method for operating the anti-fuse array structure. As shown in FIG. 5, the method includes the following operations.

In step 501, an anti-fuse array structure is provided. The provided anti-fuse array structure may be an anti-fuse array structure as described in any one of the above embodiments.

In step 502, a programming operation or a reading operation is performed on the anti-fuse array structure.

The method for operating the anti-fuse array structure provided by the embodiments of the present disclosure will be described in further detail below in combination with specific embodiments.

Firstly, referring to FIG. 2 and FIG. 4, step 501 is performed to provide an anti-fuse array structure as mentioned in any one of the above embodiments.

In some embodiments, referring to FIG. 2, the anti-fuse array structure includes an anti-fuse array area 10 and a selection circuit area 20. The anti-fuse array area 10 includes a plurality of anti-fuse cells 11 and the selection circuit area 20 includes a plurality of selection transistors 21. The selection circuit area 20 is located on at least one side of the anti-fuse array area 10.

In some embodiments, referring to FIG. 2, a plurality of anti-fuse cells 11 are arranged as an anti-fuse cell array which comprises a plurality of anti-fuse cell rows and a plurality of anti-fuse cell columns. Each of the selection transistors 21 is electrically connected to one column of anti-fuse cells 11 correspondingly, and each of the selection transistors 21 is configured to select the anti-fuse cells 11 electrically connected thereto from the anti-fuse cell array for performing a programming operation thereon.

In some embodiments, referring to FIG. 2, the anti-fuse array area includes a plurality of first active areas 12 and a plurality of anti-fuse cell gate lines 13. The plurality of first active areas 12 are arranged in parallel with each other and extend along a first direction. The plurality of anti-fuse cell gate lines 13 are arranged in parallel with each other and extend along a second direction, and the plurality of first active areas 12 and the plurality of anti-fuse cell gate lines 13 are intersected with each other to define the plurality of anti-fuse cells 11 arranged in an array.

In some embodiments, referring to FIG. 2, the selection circuit area 20 is located on one side, in the first direction, of the anti-fuse array area 10. In this way, the overall layout is simple, the anti-fuse array structure occupies a small area, the process is simple, the interconnection lines are few, and the integration level is high.

In some embodiments, referring to FIG. 2, the selection circuit area 20 includes a plurality of second active areas 22 and a selection transistor gate line 23. The plurality of second active areas 22 are located on a same side, in the first direction, of the anti-fuse array area 10, and the plurality of second active areas 22 are arranged along the second direction. The selection transistor gate line 23 extends along the second direction, and the selection transistor gate line 23 covers a partial region of each of the second active areas 22.

In some embodiments, referring to FIG. 2, a width W2 of the second active area 22 along the second direction is the same as a width W1 of the first active area along the second direction. The width of each of the second active areas is the same as the width of each of the first active areas, which is beneficial to the preparation of the mask and reduces the difficulty of the patterning process.

In some embodiments, referring to FIG. 2, the anti-fuse array structure further includes a plurality of bit lines 31 located above the plurality of first active areas 12. The plurality of bit lines 31 are arranged in parallel with each other and extend along the first direction, each of the bit lines 31 is electrically connected to first electrodes and second electrodes of anti-fuse cells 11 in one column, and each of the bit lines 31 is electrically connected to a bit line signal input end 32 through one selection transistor 21. In some embodiments of the present disclosure, one selection transistor is electrically connected to one column of anti-fuse cells, so that one column of anti-fuse cells is driven by one selection transistor. The number of control signals is greatly saved compared with one selection transistor controlling one anti-fuse cell in the related technology.

In some embodiments, referring to FIG. 2, the anti-fuse array structure further includes a plurality of first contact plugs 14 located on each of the plurality of first active areas 12 and a plurality of second contact plugs 24 located on each of the plurality of second active areas 22. The first electrodes and the second electrodes of the anti-fuse cells 11 in one column are electrically connected to each of the bit lines 31 through the plurality of first contact plugs 14. A first electrode of the selection transistor 21 is electrically connected to the bit line 31 through one second contact plug 24, and a second electrode of the selection transistor 21 is electrically connected to the bit line signal input end 32 through another second contact plug 24.

In some embodiments, referring to FIG. 4, the selection circuit area 20 includes a first selection circuit area 201 and a second selection circuit area 202. The first selection circuit area 201 is located on one side, in the first direction, of the anti-fuse array area 10, and the second selection circuit area 202 is located on the other side, in the first direction, of the anti-fuse array area 10. In this way, the area occupied by the selection circuit area is increased, so that the width of the second active areas can be increased, and further the driving current of the selection transistors can be increased.

In some embodiments, referring to FIG. 4, the anti-fuse array area 10 includes a plurality of columns of anti-fuse cells 11. Selection transistors 21 electrically connected to even-numbered columns of anti-fuse cells 11 are located on one side, in the first direction, of the anti-fuse array area 10, and selection transistors 21 electrically connected to odd-numbered columns of anti-fuse cells 11 are located on the other side, in the first direction, of the anti-fuse array area 10. Thus, the areas on two sides of the anti-fuse array area are fully utilized, and the space utilization ratio of the selection transistors on two sides of the anti-fuse array area is high.

In some embodiments, referring to FIG. 4, the selection circuit area 20 includes a plurality of second active areas 22, a first selection transistor gate line 231, a second selection transistor gate line 232 and a connector 27. The plurality of second active areas 22 are arranged on both sides, in the first direction, of the anti-fuse array area 10, and a plurality of second active areas 22 on each side are arranged along the second direction. The first selection transistor gate line 231 extends along the second direction, and the first selection transistor gate line 231 covers a partial region of each of second active areas 22 located on one side, in the first direction, of the anti-fuse array area 10. The second selection transistor gate line 232 extends along the second direction, and the second selection transistor gate line 232 covers a partial region of each of second active areas 22 located on the other side, in the first direction, of the anti-fuse array area 10. The connector 27 electrically connects the first selection transistor gate line 231 and the second selection transistor gate line 232.

In some embodiments, a width W2 of each of the second active areas along the second direction is greater than or equal to twice a width W1 of each of the first active areas along the second direction. In this way, the driving current of the selection transistor can be increased.

Next, step 502 is performed to perform the programming operation or a reading operation on the anti-fuse array structure.

In some embodiments, in combination with FIG. 2, the programming operation includes the following operations. An anti-fuse cell to be programmed is selected. A first voltage is applied to an anti-fuse cell gate line of the anti-fuse cell to be programmed. Other anti-fuse cell gate lines are set to be floating. A second voltage is applied to a selection transistor gate line of a selection transistor corresponding to the anti-fuse cell to be programmed. A third voltage is applied to a bit line signal input end electrically connected to selection transistor corresponding to the anti-fuse cell to be programmed. Other bit line signal input ends are set to be floating. The first voltage is greater than the third voltage, a difference between the first voltage and the third voltage can break down a gate dielectric layer of the anti-fuse cell to be programmed, and the second voltage is a turn-on voltage of the selection transistor. Here, the gate dielectric layer may be, for example, an oxide layer.

For example, in combination with FIG. 2, firstly, the anti-fuse cell to be programmed is selected. Exemplary, for example, the anti-fuse cell to be programmed is the anti-fuse cell in the third column and the fourth row of the anti-fuse cell array.

Next, the first voltage is applied to the anti-fuse cell gate line of the anti-fuse cell to be programmed, and other anti-fuse cell gate lines are set to be floating. Exemplarily, a first voltage is applied to the anti-fuse cell gate line FG3 in the third column and fourth row, and other anti-fuse cell gate lines FG0, FG1, FG2, FG4 . . . FG7 are set to be floating. The first voltage may be, for example, about 6V.

Next, the second voltage is applied to the selection transistor gate line of a selection transistor corresponding to the anti-fuse cell to be programmed, and the second voltage is the turn-on voltage of the selection transistor.

Then, the third voltage is applied to the bit line signal input end electrically connected to selection transistor corresponding to the anti-fuse cell to be programmed, and other bit line signal input ends are set to be floating. Exemplarily, a third voltage is applied to a bit line signal input end of the bit line BL2 electrically connected to the anti-fuse cell in the third column and fourth row, and the other bit lines BL0, BL1, BL3 . . . BL7 are set to be floating. The third voltage may be, for example, about 0V, and a difference between the first voltage and the third voltage can break down the gate dielectric layer of the anti-fuse cell to be programmed, causing the anti-fuse cell to be broken down.

In some embodiments, in combination with FIG. 2, the reading operation includes the following operations. A fourth voltage is applied to a selection transistor gate line of a selection transistor. An anti-fuse cell to be read is selected. A fifth voltage is applied to a bit line signal input end electrically connected to the selection transistor corresponding to the anti-fuse cell to be read. Other bit line signal input ends are set to be floating. A sixth voltage is applied to an anti-fuse cell gate line of the anti-fuse cell to be read. Other anti-fuse cell gate lines are set to be floating, or a seventh voltage is applied to other anti-fuse cell gate lines. The fifth voltage is greater than the sixth voltage, the fifth voltage is equal to the seventh voltage, and the fourth voltage is a turn-on voltage of the selection transistor.

For example, in combination with FIG. 2, firstly, the fourth voltage is applied to the selection transistor gate line of a selection transistor, and the fourth voltage is the staring voltage of the selection transistor. In practical operation, the fourth voltage may be equal to the second voltage.

The anti-fuse cell to be read is selected. Exemplarily, the anti-fuse cell to be read is an anti-fuse cell in a third column and a fourth row of the anti-fuse cell array.

Next, a fifth voltage is applied to a bit line signal input end electrically connected to the selection transistor corresponding to the anti-fuse cell to be read, and other bit line signal input ends are set to be floating. Exemplarily, a fifth voltage is applied to a bit line signal input end of the bit line BL2 electrically connected to the anti-fuse cell in the third column and the fourth row, and the other bit lines BL0, BL1, BL3 . . . BL7 are set to be floating. The third voltage may be, for example, about 1V.

Then, a sixth voltage is applied to the anti-fuse cell gate line of the anti-fuse cell to be read, and other anti-fuse cell gate lines are set to be floating or a seventh voltage is applied to other anti-fuse cell gate lines. Exemplarily, a sixth voltage is applied to the anti-fuse cell gate line FG3 in the third column and fourth row, and the other anti-fuse cell gate lines FG0, FG1, FG2, FG4 . . . FG7 are set to be floating or a seventh voltage is applied. The fifth voltage is greater than the sixth voltage, and the fifth voltage is equal to the seventh voltage. The sixth voltage may be, for example, about 0V, and the seventh voltage may be, for example, about 1V.

Embodiments of the present disclosure also provide a memory. The memory includes an anti-fuse memory array circuit as described in any of the above embodiments. For example, the memory includes, but is not limited to, DRAM, NAND, etc.

To sum up, in the anti-fuse array structure provided by the embodiments of the present disclosure, the selection transistors is arranged on the periphery of the anti-fuse array area, so that the anti-fuse array is greatly reduced in the length and width directions, and the area of the anti-fuse array is significantly reduced. Based on this structure, the layout of active areas and anti-fuse cell gate lines can be more uniform, which is helpful to improve the uniformity of anti-fuse array. At the same time, most of control signals of the selection transistor gate lines can be omitted, and only one set of control signals of the selection transistor gate line is need to be retained.

It should be noted that the anti-fuse array structure and the operation method thereof provided by the embodiments of the present disclosure can be applied to any integrated circuit including the structure. In the technical solutions described in various embodiments, the technical features can be arbitrarily combined in the case of no conflict. The skilled person in the field can transform the step sequence of the formation method without leaving the protection scope of the present disclosure. Under the condition that various steps in the embodiments of the present disclosure do not conflict, part of the steps can be performed at the same time or can be performed by changing the sequences.

The above is only preferred embodiments of the present disclosure, and is not intended to limit the scope of protection of the present disclosure. Any modification, equivalent replacement and improvement made within the spirit and principles of the present disclosure should be included in the scope of protection of the present disclosure.

INDUSTRIAL PRACTICALITY

In the embodiments of the present disclosure, a selection circuit area including a plurality of selection transistors is arranged on the periphery of the anti-fuse array area, so that the anti-fuse array is greatly reduced in the length and width directions, and the area of the anti-fuse array is significantly reduced. Based on this structure, the layout of active areas and anti-fuse cell gate lines can be more uniform, which is helpful to improve the uniformity of anti-fuse array. At the same time, most of control signals of the selection transistor gate lines can be omitted, and only one set of control signals of the selection transistor gate line is need to be retained.

The invention claimed is:

1. An anti-fuse array structure comprising, comprising:
an anti-fuse array area and a selection circuit area;
wherein
the anti-fuse array area comprises a plurality of anti-fuse cells, and the selection circuit area comprises a plurality of selection transistors, and the selection circuit area is located on at least one side of the anti-fuse array area;
the plurality of anti-fuse cells are arranged as an anti-fuse cell array which comprises a plurality of anti-fuse cell rows and a plurality of anti-fuse cell columns;
each of the selection transistors is electrically connected to one column of anti-fuse cells correspondingly, and each of the selection transistors is configured to select anti-fuse cells electrically connected thereto from the anti-fuse cell array for performing a programming operation thereon;
wherein the anti-fuse array area comprises:
a plurality of first active areas, wherein the plurality of first active areas are arranged in parallel with each other and extend along a first direction; and
a plurality of anti-fuse cell gate lines, wherein the plurality of anti-fuse cell gate lines are arranged in parallel with each other and extend along a second direction, and the plurality of first active areas and the plurality of anti-fuse cell gate lines are intersected with each other to define the plurality of anti-fuse cells arranged in an array.

2. The structure of claim 1, wherein,
the selection circuit area is located on one side, in the first direction, of the anti-fuse array area.

3. The structure of claim 2, wherein the selection circuit area comprises:
a plurality of second active areas, wherein the plurality of second active areas are located on a same side, in the first direction, of the anti-fuse array area, and the plurality of second active areas are arranged along the second direction; and
a selection transistor gate line, wherein the selection transistor gate line extends along the second direction, and the selection transistor gate line covers a partial region of each of the second active areas.

4. The structure of claim 3, wherein,
a width of each of the second active areas along the second direction is the same as a width of each of the first active areas along the second direction.

5. The structure of claim 1, wherein,
the selection circuit area comprises a first selection circuit area and a second selection circuit area; and
the first selection circuit area is located on one side, in the first direction, of the anti-fuse array area, and the second selection circuit area is located on the other side, in the first direction, of the anti-fuse array area.

6. The structure of claim 5, wherein,
the anti-fuse array area comprises a plurality of columns of anti-fuse cells, wherein selection transistors electrically connected to even-numbered columns of anti-fuse cells are located on one side, in the first direction, of the anti-fuse array area, and selection transistors electrically connected to odd-numbered columns of anti-fuse cells are located on the other side, in the first direction, of the anti-fuse array area.

7. The structure of claim 6, wherein the selection circuit area comprises:
a plurality of second active areas, wherein the plurality of second active areas are arranged on both sides, in the first direction, of the anti-fuse array area, and second active areas on each side are arranged along the second direction;
a first selection transistor gate line, wherein the first selection transistor gate line extends along the second direction, and the first selection transistor gate line covers a partial region of each of second active areas located on one side, in the first direction, of the anti-fuse array area;
a second selection transistor gate line, wherein the second selection transistor gate line extends along the second direction, and the second selection transistor gate line covers a partial region of each of second active areas located on the other side, in the first direction, of the anti-fuse array area; and
a connector, wherein the connector electrically connects the first selection transistor gate line and the second selection transistor gate line.

8. The structure of claim 7, wherein,
a width of each of the second active areas along the second direction is greater than or equal to twice a width of each of the first active areas along the second direction.

9. The structure of claim 3, further comprising:
a plurality of bit lines located above the plurality of first active areas, wherein the plurality of bit lines are arranged in parallel with each other and extend along the first direction, each of the bit lines is electrically connected to first electrodes and second electrodes of anti-fuse cells in one column, and each of the bit lines is electrically connected to a bit line signal input end through one selection transistor.

10. The structure of claim 9, further comprising:
a plurality of first contact plugs located on each of the plurality of first active areas, wherein each of the bit lines is electrically connected to the first electrodes and the second electrodes of the anti-fuse cells in one column through the plurality of first contact plugs; and
a plurality of second contact plugs located on each of the plurality of second active area, wherein a first electrode of the selection transistor is electrically connected to the bit line through one second contact plug, and a second electrode of the selection transistor is electrically connected to the bit line signal input end through another second contact plug.

11. A method for operating the anti-fuse array structure of claim 1, comprising:
performing a programming operation or a reading operation on the anti-fuse array structure.

12. The method of claim 11, wherein the programming operation comprises:
selecting an anti-fuse cell to be programmed, applying a first voltage to an anti-fuse cell gate line of the anti-fuse cell to be programmed, and setting other anti-fuse cell gate lines to be floating;
applying a second voltage to a selection transistor gate line of a selection transistor corresponding to the anti-fuse cell to be programmed; and
applying a third voltage to a bit line signal input end electrically connected to the selection transistor corresponding to the anti-fuse cell to be programmed, and setting other bit line signal input ends to be floating,
wherein the first voltage is greater than the third voltage, a difference between the first voltage and the third voltage is able to break down a gate dielectric layer of the anti-fuse cell to be programmed, and the second voltage is a turn-on voltage of the selection transistor.

13. The method of claim 11, wherein the reading operation comprises:
applying a fourth voltage to a selection transistor gate line of a selection transistor;
selecting an anti-fuse cell to be read, applying a fifth voltage to a bit line signal input end electrically connected to the selection transistor corresponding to the anti-fuse cell to be read, and setting other bit line signal input ends to be floating; and
applying a sixth voltage to an anti-fuse cell gate line of the anti-fuse cell to be read, and setting other anti-fuse cell gate lines to be floating or applying a seventh voltage to the other anti-fuse cell gate lines,
wherein the fifth voltage is greater than the sixth voltage, the fifth voltage is equal to the seventh voltage, and the fourth voltage is a turn-on voltage of the selection transistor.

14. A memory comprising the anti-fuse memory array circuit of claim 1.

15. The memory of claim 14, wherein,
the plurality of anti-fuse cells are arranged as an anti-fuse cell array which comprises a plurality of anti-fuse cell rows and a plurality of anti-fuse cell columns; and
each of the selection transistors is electrically connected to one column of anti-fuse cells correspondingly, and each of the selection transistors is configured to select anti-fuse cells electrically connected thereto from the anti-fuse cell array for performing a programming operation thereon.

16. The memory of claim 15, wherein the anti-fuse array area comprises:
a plurality of first active areas, wherein the plurality of first active areas are arranged in parallel with each other and extend along a first direction; and
a plurality of anti-fuse cell gate lines, wherein the plurality of anti-fuse cell gate lines are arranged in parallel with each other and extend along a second direction, and the plurality of first active areas and the plurality of anti-fuse cell gate lines are intersected with each other to define the plurality of anti-fuse cells arranged in an array.

17. The memory of claim 16, wherein the selection circuit area is located on one side, in the first direction, of the anti-fuse array area.

18. The memory of claim 17, wherein the selection circuit area comprises:
a plurality of second active areas, wherein the plurality of second active areas are located on a same side, in the first direction, of the anti-fuse array area, and the plurality of second active areas are arranged along the second direction; and
a selection transistor gate line, wherein the selection transistor gate line extends along the second direction, and the selection transistor gate line covers a partial region of each of the second active areas.

* * * * *